(12) United States Patent
Tsai et al.

(10) Patent No.: US 6,842,126 B1
(45) Date of Patent: *Jan. 11, 2005

(54) BLOCK CODING SYSTEM AND METHOD FOR DATA AGGREGATION

(75) Inventors: Tuchih Tsai, Santa Clara, CA (US); Rishy Mathew, Santa Clara, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/622,195

(22) Filed: Jul. 18, 2003

Related U.S. Application Data

(63) Continuation of application No. 10/016,931, filed on Dec. 13, 2001, now Pat. No. 6,624,770.

(51) Int. Cl.[7] .................................................. H03M 7/20
(52) U.S. Cl. ........................................ 341/102; 341/103
(58) Field of Search .......................................... 341/102

(56) References Cited

U.S. PATENT DOCUMENTS

| | | | |
|---|---|---|---|
| 4,486,739 A | 12/1984 | Franaszek et al. | 340/347 |
| 4,573,034 A | 2/1986 | Schouhamer Immink | 340/347 |
| 5,025,256 A | 6/1991 | Stevens | 341/59 |
| 5,396,239 A | 3/1995 | McMahon et al. | 341/58 |
| 6,295,010 B1 | 9/2001 | Thiesfeld | 341/58 |
| 6,362,757 B1 | 3/2002 | Lee et al. | 341/102 |
| 6,624,770 B1 * | 9/2003 | Tsai et al. | 341/102 |

* cited by examiner

*Primary Examiner*—Brian Young
*Assistant Examiner*—Joseph Lauture
(74) *Attorney, Agent, or Firm*—Ritter, Lang, & Kaplan

(57) ABSTRACT

A method of coding data for communication within a network. The method includes receiving an 8b/10b source protocol data stream containing 10-bit code and translating the data stream into an 8-bit code by converting the 10-bit code into 8-bit data and an ordered set. The method further includes transmitting the 8-bit code.

20 Claims, 8 Drawing Sheets

| Bit | Name | Usage |
|---|---|---|
| 7 | Symbol/Data | 0: Data block. 1:Symbol block |
| 6-5 | Data block length when [7] = 0 | 00: Length Field follows. 01-11: 1-3 bytes follows |
| 4-0 | Sequence Number | count from 0 to 31 |

FIG. 4

| Bit | Name | Usage |
|---|---|---|
| 7-6 | Control | 00: Normal. 01: Resvd. 10:Resvd. 11:Error. |
| 5-0 | Data Length | length in bytes excluding length filed. |

FIG. 5

| Bit | Name | Usage |
|---|---|---|
| 7 | Next Block Symbol | 0: Next Block Data, 1: Next Block Symbol |
| 6-5 | Reserved | 00 |
| 4 | Management Symbol | 1 |
| 3-0 | Management Character | 0000: Null. Shall be discarded by decoder. |
| | | 0001: Resvd. |
| | | 0010: Resvd. |
| | | 0011: Resvd. |
| | | 0100: Resvd. |
| | | 0101: Resvd. |
| | | 0110: Error Character. |
| | | 0111: Resvd. |
| | | 1000: Resvd. |
| | | 1001: Resvd. |
| | | 1010: Resvd. |
| | | 1011: Resvd. |
| | | 1100: Resvd. |
| | | 1101: Resvd. |
| | | 1111: End of Frame. |

FIG. 7

| Bit | Name | Usage | |
|---|---|---|---|
| 7 | Next Block Symbol | 0: Next Block Data, 1: Next Block Symbol | |
| 6-5 | Data Symbol Follows | 00:none, 01:one, 10:two, 11:three. | |
| 4 | Well-Known Symbol | 0 | |
| 3-0 | Control Character | 0000: K28.0 | |
| | | 0001: K28.1 | |
| | | 0010: K28.2 | |
| | | 0011: K28.3 | |
| | | 0100: K28.4 | |
| | | 0101: K28.5 | |
| | | 0110: K28.6 | |
| | | 0111: K28.7 | |
| | | 1000: K23.7 | |
| | | 1001: K27.7 | |
| | | 1010: K29.7 | |
| | | 1011: K30.7 | |
| | | 1100: Resvd. | |
| | | 1101: Resvd. | |
| | | 1111: Resvd. | |

FIG. 6

| Function | Ordered Set | | |
|---|---|---|---|
| IDLE | K28.5 | -- | -- |
| NOS | K28.5 | D0.2 | -- |
| CSOF | K28.1 | K28.7 | -- |
| PSOF | K28.5 | K28.7 | -- |
| ABORT | K28.6 | K28.4 | K28.4 |
| DEOF | K28.6 | K28.1 | K28.1 |
| PEOF | K28.6 | K28.2 | K28.5 |
| UD | K28.5 | D15.2 | -- |
| UDR | K28.5 | D16.2 | -- |
| OFFLINE | K28.5 | D24.2 | -- |
| Reserved | K28.5 | Data | |

FIG. 9

| 7 | 6 | 5 | 4 | 3 | 2 | 1 | 0 |
|---|---|---|---|---|---|---|---|
| 1 | 00 | | Sequence Number 00000 | | | | |
| 1 (Next) | 01 | | symbol | | | | |
| Ordered Set Data | | | | | | | |
| 1 (Next) | 00 | | symbol | | | | |
| 1 (Next) | 00 | | symbol | | | | |
| 1 (Next) | 01 | | symbol | | | | |
| Ordered Set Data | | | | | | | |
| 1(Next) | 00 | | symbol (PSOF - K28.5 - 0101) | | | | |
| 0 (Next) | 00 | | symbol (PSOF - K28.7 - 0111) | | | | |
| 00(Control) | | | Length_0 | | | | |
| Length_1 | | | | | | | |
| User Data | | | | | | | |
| User Data | | | | | | | |
| User Data | | | | | | | |
| ........ | | | | | | | |
| 1 (Next) | 00 | | symbol (PEOF - K28.6 - 0110) | | | | |
| 1 (Next) | 00 | | symbol (PEOF - K28.2 - 0010) | | | | |
| 1(Next) | 00 | | symbol (PEOF - K28.5 - 0101) | | | | |

FIG. 8

| Function | RD | Ordered Set | | | |
|---|---|---|---|---|---|
| IDEL | Negative | K28.5 | D21.4 | D21.5 | D21.5 |
| R_RDY | Negative | K28.5 | D21.4 | D10.2 | D10.2 |
| OLS | Negative | K28.5 | D21.1 | D10.4 | D21.2 |
| NOS | Negative | K28.5 | D21.2 | D31.5 | D5.2 |
| LR | Negative | K28.5 | D9.2 | D31.5 | D9.2 |
| LRR | Negative | K28.5 | D21.1 | D31.5 | D9.2 |
| SOFc1 | Negative | K28.5 | D21.5 | D23.0 | D23.0 |
| SOFi1 | Negative | K28.5 | D21.5 | D23.2 | D23.2 |
| SOFn1 | Negative | K28.5 | D21.5 | D23.1 | D23.1 |
| SOFi2 | Negative | K28.5 | D21.5 | D21.2 | D21.2 |
| SOFn2 | Negative | K28.5 | D21.5 | D21.1 | D21.1 |
| SOFi3 | Negative | K28.5 | D21.5 | D22.2 | D22.2 |
| SOFn3 | Negative | K28.5 | D21.5 | D22.1 | D22.1 |
| SOFf | Negative | K28.5 | D21.5 | D24.2 | D24.2 |
| EOFt | Negative | K28.5 | D21.4 | D21.3 | D21.3 |
| EOFt | Positive | K28.5 | D21.5 | D21.3 | D21.3 |
| EOFdt | Negative | K28.5 | D21.4 | D21.4 | D21.4 |
| EOFdt | Positive | K28.5 | D21.5 | D21.4 | D21.4 |
| EOFa | Negative | K28.5 | D21.4 | D21.7 | D21.7 |
| EOFa | Positive | K28.5 | D21.5 | D21.7 | D21.7 |
| EOFn | Negative | K28.5 | D21.4 | D21.6 | D21.6 |
| EOFn | Positive | K28.5 | D21.5 | D21.6 | D21.6 |
| EOFdti | Negative | K28.5 | D10.4 | D21.4 | D21.4 |
| EOFdti | Positive | K28.5 | D10.5 | D21.4 | D21.4 |
| EOFni | Negative | K28.5 | D10.4 | D21.6 | D21.6 |
| EOFni | Positive | K28.5 | D10.5 | D21.6 | D21.6 |
| Reserved | - | K28.5 | Dxx.y | Dxx.y | Dxx.y |

FIG. 10

BLOCK CODING SYSTEM AND METHOD FOR DATA AGGREGATION

This application is a continuation of application Ser. No. 10/016,931, filed on Dec. 13, 2001 which is now U.S. Pat. No. 6,624,770.

BACKGROUND OF THE INVENTION

The present invention relates generally to communication networks, and more specifically, to a coding scheme for data aggregation of 8b/10b protocols.

Wavelength Division Multiplexing (WDM) is an optical technology that couples many wavelengths in the same fiber, thus effectively increasing the aggregate bandwidth per fiber to the sum of the bit rates of each wavelength. Dense WDM (DWDM) is a technology with a larger (denser) number of wavelengths (e.g., >40) coupled into a fiber than WDM. Systems may support, for example, 100 wavelengths per fiber, enabling a single fiber to carry several hundred gigabits of information. DWDM increases the capacity of embedded fiber by first assigning incoming optical signals to specific frequencies within a designated frequency band and then multiplexing the resulting signals out onto one fiber. DWDM combines multiple optical signals so that they can be amplified as a group and transported over a single fiber to increase capacity. Each signal can be at a different rate and in a different format. DWDM applications include ultra-high bandwidth long haul as well as ultra-high-speed metropolitan or inner city-networks, and at the edge of other networks such as SONET, Internet protocol (IP) and asynchronous transfer mode (ATM).

In conventional DWDM applications, many different protocols need to be aggregated into a single data channel to be transported over a wavelength. For example, a single 10 Gigabit DWDM channel can carry multiple lower-speed source application protocols such as ESCON (200M), Fiber Channel (1.0625G) or Gigabit Ethernet (1.35G), and multiple channels of those protocols need to be converged to one transport interconnect signal, such as the 10 Gigabit Ethernet (IEEE 802.3.ae) or SONET (OC-48, OC-192), which are the most prominent choices for DWDM technology.

Communication systems transmit signals by means of a number of coding techniques. The 8b/10b code translates 8 bits into one of 256 predetermined 10 bit codes. The extra two bits of code serve a variety of purposes, including differentiating control blocks from data blocks, error detection (disparity control), frame delimiting with data transparency, DC voltage balance, and transitions for clock recovery. An 8b/10b encoder is used to convert 8b data into 10b data. 8b/10b encoding is used in transmitting data on Fibre Channel, ESCON (Enterprise Serial Connection), and Gigabit Ethernet, for example. ESCON was developed by IBM and is widely deployed in large mainframe installations. A mainframe computer may have hundreds of ESCON I/O channels. These channels may be connected to other mainframes or to peripheral devices. Fibre channel is a standard used for the same set of applications as ESCON.

FIG. 1 illustrates operation of the 8b/10 code. The code combines a 5b/6b code and a 3b/4b code. A mapping is defined that maps each of the possible 8-bit source blocks into a 10-bit code block. There is also a function called disparity control that keeps track of the excess of zeros over ones or ones over zeros. The unencoded input includes 8 bits (A, B, C, D, E, F, G, H) and a control variable. The control line input indicates whether lines A through H are data or control bits. The input information is encoded into bits (a, b, c, d, e, f, g, h, i, j) of a 10-bit transmission character. The control variable is either a "D" for data characters or a "K" for special characters. Each valid transmission character is given a name using the following convention: Kxx.y, where K is the control variable of the unencoded information byte, xx is the decimal value of the binary number composed of the bits E, D, C, B, and A, and y is the decimal value of the binary number composed of the bits H, G of the unencoded information byte. The information received is recovered 10 bits at a time and those transmission characters used for data are decoded into one of the 256 8-bit combinations. Some of the remaining transmission characters are used for protocol management functions.

Since the DWDM protocol of either 10 Gigabit Ethernet or SONET is different from the source application protocols, one way to converge the application protocols is to participate the protocol and terminate the application at the connecting node and regenerate the application protocol at the other end. This, however, involves complicated and expensive system designs. A more efficient method is to perform a transparent interconnect, so that the application protocol data is directly carried through 10 Gigabit Ethernet or SONET. However, protocols such as ESCON and Fibre Channel use the 10b code of the 8b/10b scheme as a part of the protocol signaling. The 10 Gigabit Ethernet employs 8b/10b code for physical communication; however, it does not carry the 10b symbols on user data. SONET uses a total different scrambling scheme and can only carry 8b data.

There is, therefore, a need for a method and system for translating source 8b/10b protocol signals into 8-bit user data.

SUMMARY OF THE INVENTION

A method of coding data for communication within a network is disclosed. The method generally includes receiving an 8b/10b source protocol data stream containing 10-bit code and translating the data stream into an 8-bit code by converting the 10-bit code into 8-bit data and an ordered set. The method further includes transmitting the 8-bit code.

In another aspect of the invention, a method of aggregating different protocols into a single data channel generally comprises receiving a source protocol data stream comprising a plurality of input bits containing data and control information. The method further includes encoding the input bits to translate the data stream into a code containing bit data having a smaller number of bits than the code of the received signals, wherein the encoded bits contain data and ordered sets. The encoded code is combined with another data stream of encoded code having a different source protocol.

A system for coding data for communication within a network generally comprises an ordered set processor operable to receive an 8b/10b source protocol data stream containing 10-bit code and translating the data stream into an 8-bit code by converting the 10-bit code into 8-bit data and an ordered set. The system further includes a data encoder/decoder.

A computer program product for coding data for communication within a network generally comprises code that receives an 8b/10b source protocol data stream containing 10-bit code; code that translates the data stream into an 8-bit code by converting the 10-bit code into 8-bit data and an ordered set; and code that transmits the 8-bit code. A computer-readable storage medium is provided for storing the codes.

The above is a brief description of some deficiencies in the prior art and advantages of the present invention. Other features, advantages, and embodiments of the invention will be apparent to those skilled in the art from the following description, drawings, and claims.

BRIEF DESCRIPTION OF THE DRAWINGS

FIG. 4 is a table showing fields for a header symbol of the present invention.

FIG. 5 is a table showing length field.

FIG. 6 is a table showing symbol block encoding.

FIG. 7 is a table showing management symbol encoding.

FIG. 8 is a table illustrating an example of an ESCON data encode.

FIG. 9 is a table listing ESCON control ordered sets.

FIG. 10 is a table listing Fibre Channel control ordered sets.

Corresponding reference characters indicate corresponding parts throughout the several views of the drawings.

DETAILED DESCRIPTION OF THE INVENTION

The following description is presented to enable one of ordinary skill in the art to make and use the invention. Descriptions of specific embodiments and applications are provided only as examples and various modifications will be readily apparent to those skilled in the art. The general principles described herein may be applied to other embodiments and applications without departing from the scope of the invention. Thus, the present invention is not to be limited to the embodiments shown, but is to be accorded the widest scope consistent with the principles and features described herein. For purpose of clarity, details relating to technical material that is known in the technical fields related to the invention have not been described in detail.

The present invention operates in the context of a data communication network including multiple network elements. A system of the present invention provides an efficient, low-latency and high-density scheme to aggregate 8b/10b based protocols over a DWDM network. The network may be configured to use protocols such as ESCON, Fibre Channel or Gigabit Ethernet, for example. The system translates source 8b/10b protocol signals into 8-bit user data.

Figure 2:
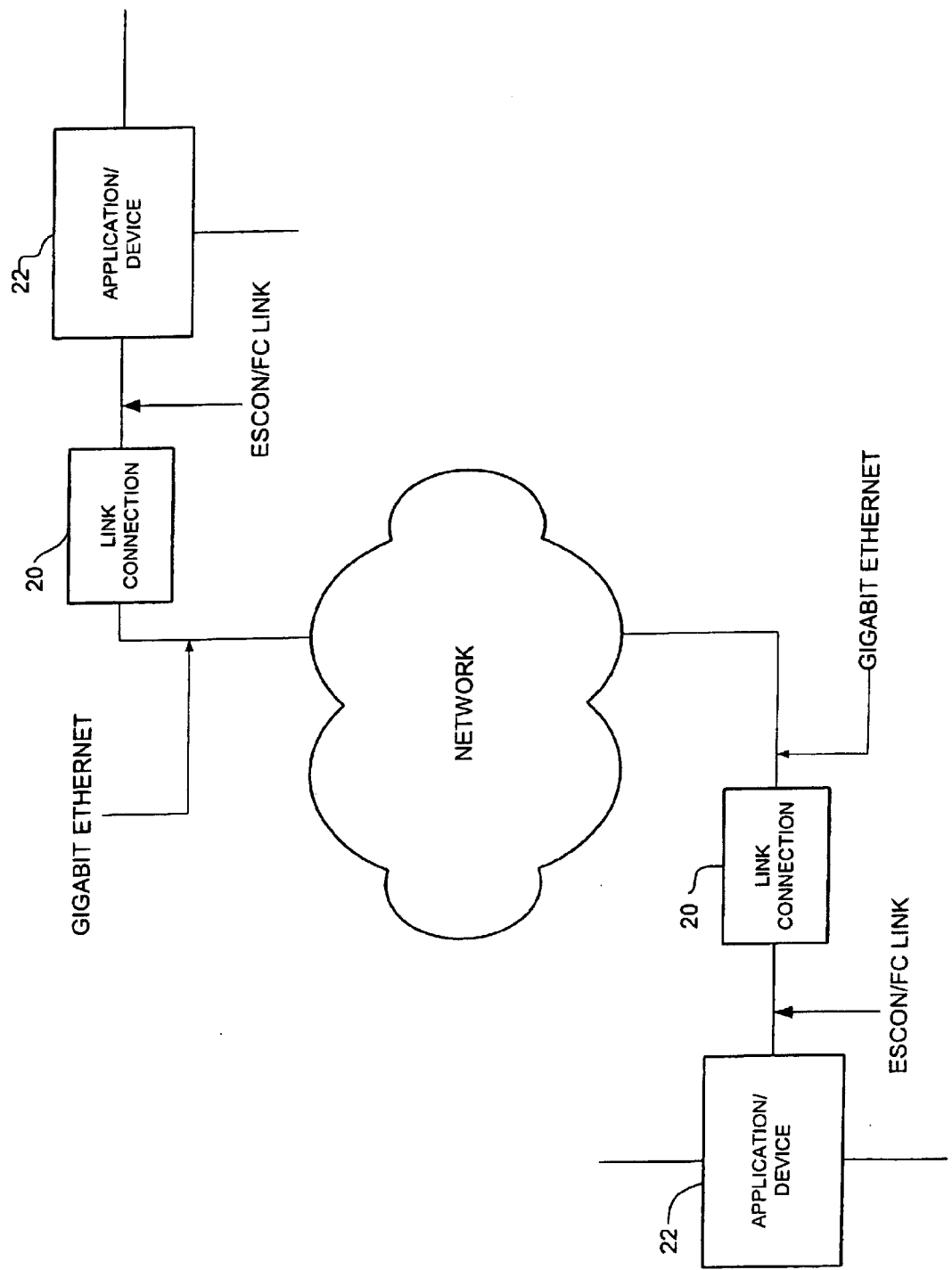
FIG. 2 is diagram illustrating link connections of the present invention in an ESCON/Fibre Channel application.

Referring now to the drawings, and first to FIG. 2, a link connection 20 of the present invention may provide interconnection for 200 Mb ESCON and 1.0625 Gb Fibre Channel to 1.25 Gigabit Ethernet on a user 1 Gigabit medium independent interface (GMII), for example. The connection is transparent to users, applications, and other upper layer protocols of the ESCON and Fibre Channel links. An application or device 22 sends data over an ESCON or Fibre Channel link to a Gigabit Ethernet channel that can carry multiple lower-speed source application protocols. The 10-bit code of the 8b/10b scheme is used by ESCON and Fibre Channel as part of the protocol signaling. Since the 10-bit control characters are a part of the protocols, they must be carried through as well as the user data.

Although the Gigabit Ethernet employs the 8b/10b code, it does not use any 10-bit control symbols in the protocol. The link connection translates the source protocol signals into an 8-bit code for use by the Gigabit Ethernet protocol.

Figure 1:
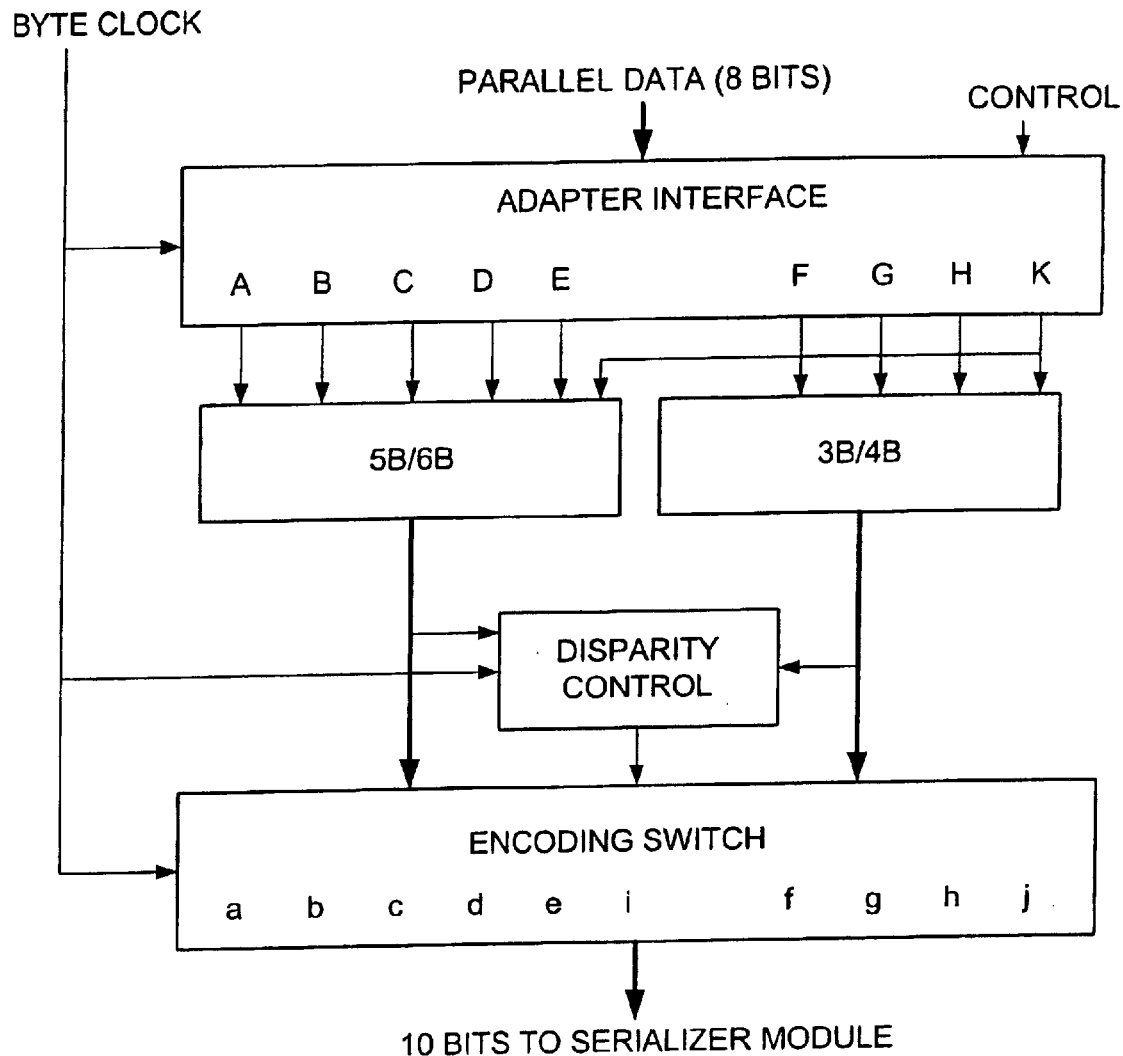
FIG. 1 is a diagram illustrating a prior art 8b/10b coding scheme.
Figure 3:
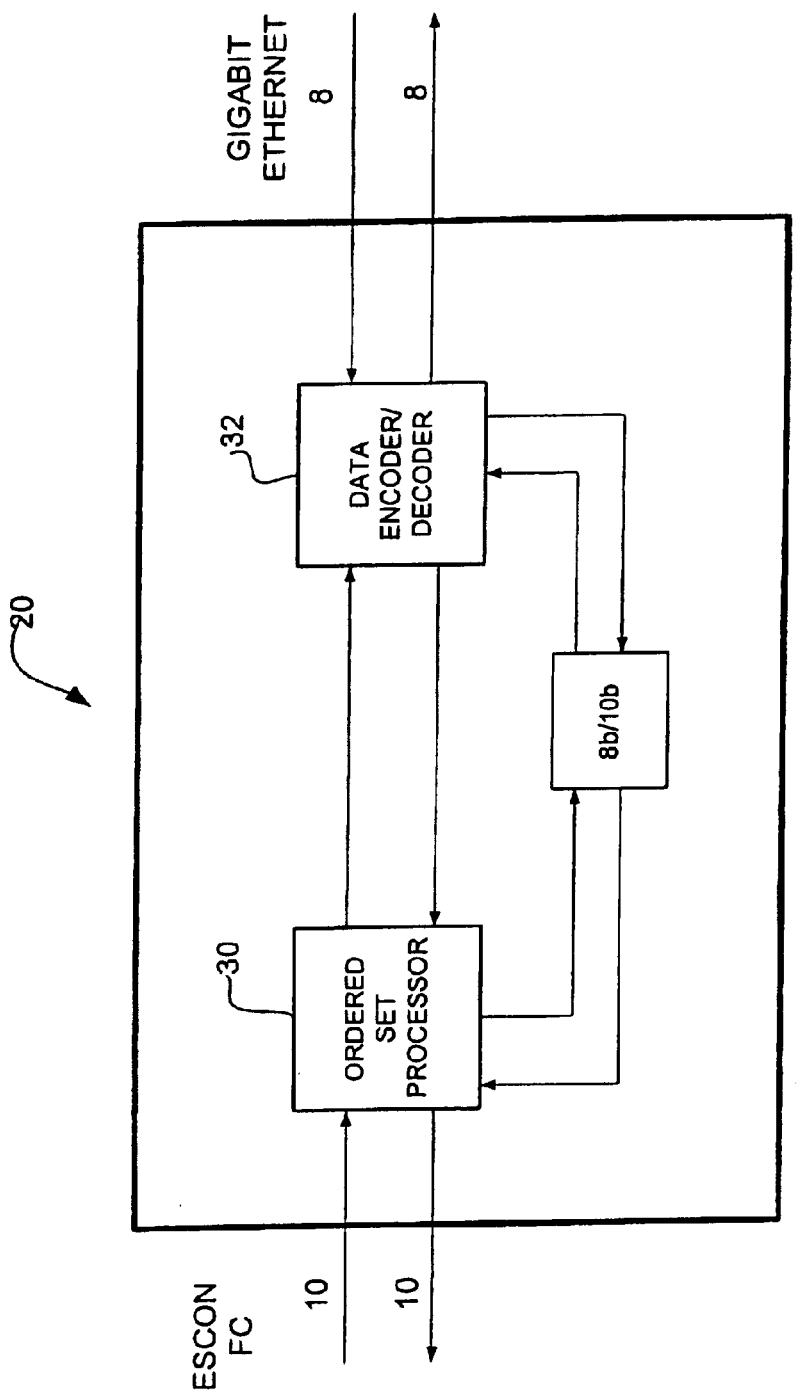
FIG. 3 is a diagram illustrating details of the link connection of FIG. 2.

FIG. 3 illustrates additional detail of the link connection 20 of FIG. 1. The 10-bit of ESCON and Fibre Channel is received at the link connection 20, processed by an ordered set processor 30 and encoded by a data encoder/decoder 32 to create 8-bit code for the Gigabit Ethernet interface. The ordered set processor 30 uses an 8-bit code to efficiently map both K and D data, as further described below. The data encoder 32 is used to encode 10-bit symbols of ESCON and Fibre Channel into the 256 domain of 8-bit code. The decoder may perform in a cut-through byte by byte operation since all information is encoded in sequence. When an error is encountered, the decoder can implement a local error reporting and accounting method.

The 8b/10b code provides a potential 1024 code words for signaling. A convention of K/D with numbers is used to indicate the data. The 8-bit 256 user data is represented by Dxx.y, other control codes are represented by Kxx.y where xx is from 0 to 31 and y is from 0 to 7. For example, D28.5 represents 10b code 0011110010 or 1100000010 depending on the code disparity.

The 8b/10b based protocol uses a 10-bit domain data as a part of the protocol signaling called ordered set. An ordered set is a 4-byte transmission word which has a special character as its first transmission character. An ordered set may be a frame delimiter, a primitive signal, or a primitive sequence. Ordered sets are used to distinguish control information from data. For example, in ESCON, K28.5 itself is used for IDLE, K28.1+K28.7 is Start of Frame (SOF), K28.6+K28.2+K28.5 is End of Frame (EOF), and ABORT is K28.6+K28.4+K28.4. In Fibre Channel, the ordered set has four symbols. For example, IDLE consists of K28.5+D21.4+D21.5+D21.5. The ordered set may be any number and combination of K and D symbols.

The present invention uses an 8-bit code to efficiently map both K and D data. The system uses a protocol symbol that is a K control character. The K control character may be followed by one to three user data codes (e.g., Dxx.y), or not followed by any D codes. An 8-bit domain data block referred to as a frame, encapsulates a source of 8b/10b protocol data stream (i.e., stream of K and D data of the source protocol) and is sent through a DWDM channel. The length of the frame is determined by bandwidth factors between the total number of the source protocol channels and the DWDM data rate and is preferably implementation and system dependent.

A frame starts with a one byte header to begin the encapsulation and also provides a 5-bit sequence number for the frame. The header identifies the beginning of a mapped data frame and is the first byte of the encapsulation packet. The header also identifies whether the character following the header is a symbol (K) or data (D). Details of the header symbol are shown in FIG. 4. The header sequence count starts from zero after reset and is then continuously incremented. The sequence number is used for error detection at a receiving node.

As previously discussed, the encoding scheme of the present invention uses an 8-bit code to represent a K character that may be followed by up to 3 bytes of D data characters. More than 3 bytes of D data characters are preceded with a length field that points to the end of a data block. The data length field indicates the number of user data between symbols. Due to latency considerations, the actual length number may vary. The minimum number of length is one byte, as shown in the table of FIG. 5. If the length is two bytes or more, the length count continues and Bits 5–0 are the MSBs (most significant bytes) of the total length. In each realization, the encoder and decoder use the same number length. An 8b/10b code error in a data block is indicated once in its data length field until a correct K character is observed or a new data length field is established to guarantee the encoding bandwidth.

After a length indicated D data block, either another symbol code or data length field may follow. The data length field proceeds a data block for data more than 3 bytes, indicating the length of the data as well as whether the character that follows the data block is a symbol (K) or another data length field. The procedure continues and can stop at any time to complete a frame. The data integrity of the frame is protected using the DWDM data protocol's protection code (e.g., 32-bit CRC in 10G Ethernet).

The block coding also includes a symbol encode, which is an 8-bit data encoding the K and D combination, and a management encode, which is an 8-bit data encoding management messages. The symbol block encoding is shown in FIG. 6. The protocol symbol K character is encoded in 8-bit data and indicates if the character following the symbol block is another symbol (K) or data (D). The data length field follows data (D). The symbol encode includes all of the assigned ordered sets. Bit 7 indicates if the beginning of the next block is a symbol. Bits 6 and 5 indicate how many data bytes follow the symbol as a part of the ordered set. Bits 4 to 0 are symbol code and identify the control character of the symbol. Bit 4=0 is used for well-known control code, and bit 4=1 is used for other management messages such as error. For example, in Fibre Channel, the symbol is x 1110101 which is K28.5 followed by 3 bytes of data as a part of the ordered set.

The management symbol encode is shown in FIG. 7. Management messages such as error are defined in the table of FIG. 7. An error symbol indicates that there was an error when receiving the character which can not be identified. A null symbol is used for data filling and is discarded by the receiving decoder. The current encapsulated packet is terminated by EOF (end of field) symbol and the rest of the data is discarded by the receiving decoder. An 8b/10b code error from the source protocol is encoded in a management encode for error unless the error starts in a data block when a data length is already established. After a reset occurs, the decoder assumes the expecting sequence count to be zero and replaces its value with the received packet sequence count after comparing them. An error shall be reported if the expecting sequence count does not match with the packet sequence count.

FIG. 8 illustrates an example of an ESCON data encode. The system described above allows the source protocol data stream to be segmented at any length and any time, providing full flexibility for other design considerations such as bandwidth factor. For example, the frame length is different in encapsulating 40 ports of ESCON and 10 ports of Fibre Channel, however, the same scheme applies. Also, the coding enables the design to achieve high performance of low latency and high density data aggregation. The scheme of the present invention may be implemented in a staged cut-through pipeline operation to further reduce encoding latency since it does not need to complete the entire frame before it starts to send it. The encoding scheme may be applied to the 8b/10b based protocols and the decoder can operate entirely in cut-through mode.

FIGS. 9 and 10 show ordered sets used in the 8b/10b protocol signaling of ESCON and Fibre Channel, respectively. The tables include a list of functions and the corresponding ordered sets. The running disparity is also included in the table containing the Fibre Channel ordered sets. In ESCON the number of K or D code in an ordered set is not fixed, while in Fibre Channel, the ordered set starts with K28.5 and is followed by 3 data (D) codes.

It is to be understood that the block coding scheme of the present invention may be used with protocols other than ESCON and Fibre Channel, without departing from the scope of the invention. Also, the data fields and ordered sets shown and described above are provided only as examples and other formats and ordered sets may be used without departing from the scope of the invention. Furthermore, the system and method of the present invention may be used for data aggregation of coding protocols other than 8b/10b.

Figure 11:
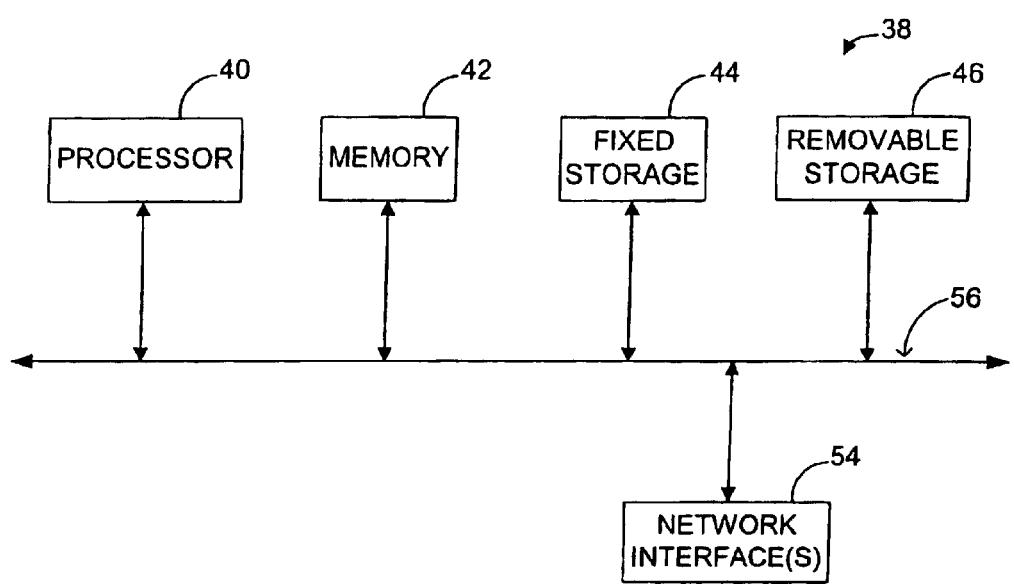
FIG. 11 is a system block diagram of a computer system that can be utilized to execute software of an embodiment of the present invention.

FIG. 11 shows a system block diagram of computer system 38 that may be used to execute software of an embodiment of the invention. The computer system 38 includes memory 42 which can be utilized to store and retrieve software programs incorporating computer code that implements aspects of the invention, data for use with the invention, and the like. Exemplary computer readable storage media include CD-ROM, floppy disk, tape, flash memory, system memory, and hard drive. Additionally, a data signal embodied in a carrier wave (e.g., in a network including the Internet) may be the computer readable storage medium. Computer system 38 further includes subsystems such as a central processor 40, fixed storage 44 (e.g., hard drive), removable storage 46 (e.g., CD-ROM drive), and one or more network interfaces 54. Other computer systems suitable for use with the invention may include additional or fewer subsystems. For example, computer system 38 may include more than one processor 40 (i.e., a multi-processor system) or a cache memory. The computer system 38 may also include a display, keyboard, and mouse (not shown) for use as a host.

The system bus architecture of computer system 38 is represented by arrows 56 in FIG. 11. However, these arrows are only illustrative of one possible interconnection scheme serving to link the subsystems. For example, a local bus may be utilized to connect the central processor 40 to the system memory 42. Computer system 38 shown in FIG. 11 is only one example of a computer system suitable for use with the invention. Other computer architectures having different configurations of subsystems may also be utilized. Communication between computers within the network is made possible with the use of communication.

As can be observed from the foregoing, the present invention has numerous advantages. The present invention provides a system that can achieve high performance of low latency and high density of data aggregation. The scheme may be implemented in a staged cut-through pipeline operation to further reduce encoding latency since it does not need to complete the entire frame before starting to send it.

Although the present invention has been described in accordance with the embodiments shown, one of ordinary skill in the art will readily recognize that there could be variations made to the embodiments without departing from the scope of the present invention. Accordingly, it is intended that all matter contained in the above description and shown in the accompanying drawings shall be interpreted as illustrative and not in a limiting sense.

What is claimed is:

1. A computer program product for a method of communication within a network, the method comprising:
   code that receives an 8b/10b source protocol data stream containing 10-bit code;

code that translates the data stream into an 8-bit code by converting the 10-bit code into 8-bit data and an ordered set, wherein the source 8b/10b protocol data stream is encapsulated in a frame;

code that segments the source protocol data stream at an unspecified length and time;

code that transmits the 8-bit code; and a computer-readable storage medium for storing the codes.

2. The computer program product of claim 1 wherein the frame is an 8-bit domain data block.

3. The computer program product of claim 1 wherein the frame comprises a header identifying a sequence number.

4. The computer program product of claim 1 wherein the code that receives data receives data from a Fibre Channel network.

5. The computer program product of claim 1 wherein the code that translates the data stream maps the data.

6. The computer program product of claim 1 wherein the code that translates data encodes management messages.

7. A computer program product for aggregating different protocols into a single data channel, the product comprising:

code that receives a source protocol data stream comprising a plurality of input bits containing data and control information;

code that encodes the input bits to translate the data stream into a code containing bit data having a smaller number of bits than the code of the received signals, wherein the encoded bits contain data and ordered sets;

code that combines the encoded code with another data stream of encoded code having a different source protocol; and a computer-readable storage medium for storing the codes.

8. The computer program product of claim 7 wherein the code that combines the encoded code aggregates the encoded codes into a data channel in a DWDM system.

9. The computer program product of claim 7 wherein the computer readable medium is selected from the group consisting of CD-ROM, floppy disk, tape, flash memory, system memory, hard drive, and data signal embodied in a carrier wave.

10. The system of claim 9 wherein the processor means is operable to create a frame comprising a block of 8-bit data that encapsulates the source 8b/10b protocol data stream.

11. The system of claim 10, wherein the frame header includes a protocol symbol character followed by up to three data characters.

12. A system for coding data for communication within a network, the system comprising:

processing means operable to receive an 8b/10b source protocol data stream containing 10-bit code and translate the data stream into an 8-bit code by converting the 10-bit code into 8-bit data and an ordered set; and means for encoding and decoding data;

wherein the encoding and decoding means are configured to operate in cut-through mode.

13. The system of claim 12 wherein the frame includes a header identifying a sequence number for the frame.

14. A system for aggregating different protocols into a single data channel, the system comprising:

a processor operable to receive a source protocol data stream comprising a plurality of input bits containing data and control information;

an encoder operable to encode the input bits to translate the data stream into a code containing bit data having a smaller number of bits than the code of the received signals, wherein the encoded bits contain data and ordered sets; and memory configured to at least temporarily store said code containing bit data;

wherein the encoded code is combined with another data stream of encoded code having a different source protocol.

15. The system of claim 14 wherein the processor is operable to create a frame comprising a block of 8-bit data.

16. The system of claim 15 wherein the data stream is an 8b/10b protocol data stream and the 8-bit data encapsulates the data stream.

17. A system for coding data for communication within a network; the system comprising:

means for receiving an 8b/10b source protocol data stream containing 10-bit code;

means for translating the data stream into an 8-bit code by converting the 10-bit code into 8-bit data and an ordered set;

means for segmenting the source protocol data stream at an unspecified length and time; and means for transmitting the 8-bit code.

18. The system of claim 17 further comprising means for encoding a protocol symbol to 8-bit data.

19. The system of claim 17 further comprising means for mapping data.

20. The system of claim 17 wherein the translating means comprises means for encoding management messages.

* * * * *